(12) United States Patent
Fleissner et al.

(10) Patent No.: US 9,774,012 B2
(45) Date of Patent: Sep. 26, 2017

(54) ORGANIC LIGHT-EMITTING COMPONENT

(71) Applicant: OSRAM OLED GmbH, Regensburg (DE)

(72) Inventors: Arne Fleissner, Regensburg (DE); Marc Philippens, Regensburg (DE)

(73) Assignee: OSRAM OLED GmbH, Regensburg (DE)

(*) Notice: Subject to any disclaimer, the term of this patent is extended or adjusted under 35 U.S.C. 154(b) by 0 days.

(21) Appl. No.: 15/101,407

(22) PCT Filed: Dec. 2, 2014

(86) PCT No.: PCT/EP2014/076285
§ 371 (c)(1),
(2) Date: Jun. 2, 2016

(87) PCT Pub. No.: WO2015/082486
PCT Pub. Date: Jun. 11, 2015

(65) Prior Publication Data
US 2016/0308169 A1    Oct. 20, 2016

(30) Foreign Application Priority Data
Dec. 4, 2013  (DE) .................. 10 2013 113 486

(51) Int. Cl.
*H01L 51/52* (2006.01)
*H01L 51/50* (2006.01)

(52) U.S. Cl.
CPC ...... *H01L 51/5275* (2013.01); *H01L 51/5024* (2013.01); *H01L 51/52* (2013.01); *H01L 51/504* (2013.01); *H01L 2251/5323* (2013.01)

(58) Field of Classification Search
CPC ... H01L 2924/12044; H01L 2251/5369; H01L 51/5275; H01L 51/5203; H01L 51/5206;
(Continued)

(56) References Cited

U.S. PATENT DOCUMENTS 7,608,856 B2  10/2009  Becker et al.
8,258,693 B2   9/2012  Cok et al.
(Continued)

FOREIGN PATENT DOCUMENTS

DE  102006023509 A1  1/2007
DE  112006002463 T5  8/2008
(Continued)

OTHER PUBLICATIONS

Imai Y. et al, "Transparent Poly (Bisphenol A Carbonate)—Based Nanocomposites with High Refractive Index Nanoparticles", European Polymer Journal 45; 2009; pp. 630-638.
(Continued)

*Primary Examiner* — Roy Potter
(74) *Attorney, Agent, or Firm* — McDermott Will & Emery LLP

(57) ABSTRACT

An organic light-emitting component (100) is specified, which comprises a carrier (1) and an organic layering sequence (2) arranged on the carrier (1). The organic layering sequence (2) comprises at least two organic layers, wherein at least one of the organic layers is designed as an emitting layer (23). The emitting layer (23) emits light (200) of a first wavelength range, which has an intensity maximum at a first wavelength. Further, the organic light-emitting component (100) comprises an anode (3) and a cathode (4) which provide the electrical contacting of the organic layering sequence (2). Further, the organic light-emitting component (100) has at least one nanoparticle layer (20), wherein one nanoparticle layer (20) is an organic layer of the organic layering sequence (2) provided with first nanoparticles (5). The first nanoparticles (5) have a refractive index (nN) that is smaller than at least one refractive index of an organic material of one of the organic layers. Further, at least one nanoparticle layer (20) is not in direct contact with the
(Continued)

Figure 1:
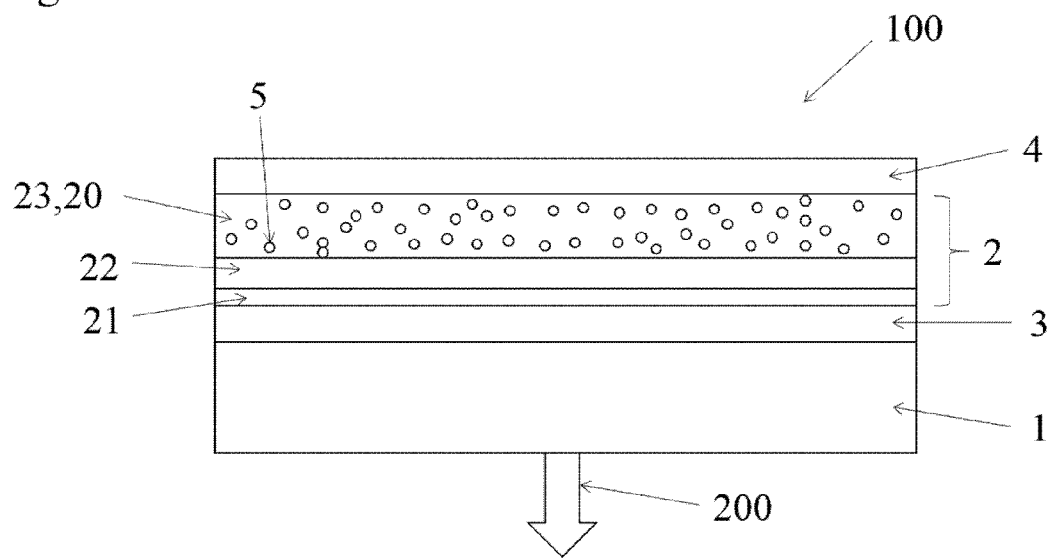

anode (3). In addition, the first nanoparticles (5) have a diameter that is smaller than one-fourth of the first wavelength at which the light (200) emitted by the emitting layer (23) has an intensity maximum.

17 Claims, 3 Drawing Sheets

(58) Field of Classification Search
CPC ............... H01L 51/52; H01L 51/5024; H01L 2251/5323; H01L 51/504
See application file for complete search history.

(56) References Cited

U.S. PATENT DOCUMENTS

| 8,338,512 | B2 | 12/2012 | Hsu | |
| 9,515,290 | B2* | 12/2016 | Lim | H01L 51/5268 |
| 2006/0186802 | A1 | 8/2006 | Cok et al. | |
| 2007/0176174 | A1 | 8/2007 | Lee et al. | |
| 2007/0221914 | A1 | 9/2007 | Becker et al. | |
| 2008/0049442 | A1 | 2/2008 | Choo et al. | |
| 2010/0110551 | A1* | 5/2010 | Lamansky | G02B 5/021 359/599 |
| 2012/0206923 | A1 | 8/2012 | Tanaka et al. | |
| 2013/0267629 | A1 | 10/2013 | Fukuoka et al. | |
| 2014/0370370 | A1* | 12/2014 | Kawase | H01M 2/024 429/176 |

FOREIGN PATENT DOCUMENTS

| DE | 102012204432 A1 | 10/2013 |
| EP | 2287938 A1 | 2/2011 |
| EP | 2287939 A1 | 2/2011 |
| EP | 2482619 A1 | 8/2012 |
| WO | 2012006317 A1 | 1/2012 |

OTHER PUBLICATIONS

Mehendia S. et al., "Tuning of Refractive Index of Poly (Vinyl Alcohol): Effect of Embedding Cu and Ag Nanoparticles", Journal of Applied Physics 113; 2013; pp. 073103-1-073103-7.

* cited by examiner

ORGANIC LIGHT-EMITTING COMPONENT

An organic light-emitting component is specified.

One object to be achieved consists in specifying an organic light-emitting component having an efficient coupling-out of light.

This object is achieved, inter alia, by means of a component having the features of the independent patent claim. The dependent patent claims relate to advantageous configurations and developments.

In accordance with at least one embodiment, the organic light-emitting component is an organic light-emitting diode, OLED for short.

In accordance with at least one embodiment of the organic light-emitting component, the latter comprises a carrier. The carrier preferably comprises a radiation-transmissive, in particular transparent or milkily hazy, material, for example glass. Preferably, the carrier consists of at least one transparent material. The carrier can be embodied as a substrate that is suitable for applying an organic layer sequence. Furthermore, the carrier can comprise or consist of a conductive material.

In accordance with at least one embodiment of the organic light-emitting component, an organic layer sequence is arranged on the carrier. The organic layer sequence comprises at least two organic layers, wherein at least one of the organic layers is embodied as an emitter layer. The at least one emitter layer is provided for emitting light in at least one first wavelength range. The light emitted by the at least one emitter layer furthermore has an intensity maximum at a first wavelength.

The at least one emitter layer has for example in each case a thickness of $\geq 50$ nm, for example $\geq 100$ nm, for example $\geq 150$ nm. Alternatively or additionally, the at least one emitter layer can have a thickness of $\leq 400$ nm, for example $\leq 300$ nm, for example $\leq 250$ nm.

Hereinafter, the at least one emitter layer is designated as the emitter layer. In particular, therefore, when mention is made of the emitter layer, a plurality of emitter layers can be meant. If the layer sequence comprises at least two emitter layers, at least two individual emitter layers can be connected to one another for example via at least one charge generating layer, CGL for short. Furthermore, each emitter layer itself can comprise a plurality of differently or identically embodied emitter layers which directly adjoin one another.

The light in the first wavelength range that is emitted by the emitter layer is preferably light in the visible range, for example white, blue, green or red light. For generating light of a desired color, the emitter layer can be provided with one or a plurality of different fluorescent and/or phosphorescent emitter materials. The color locus of the light emitted by the emitter layer can be set by suitable mixing of the emitter materials. Furthermore, if present, different emitter layers can be provided with different emitter materials.

The intensity maximum of the light emitted by the emitter layer is preferably in the visible spectral range of the electromagnetic spectrum and can have an intensity maximum at wavelengths of $\geq 400$ nm and/or at wavelengths of $\leq 800$ nm.

The organic layer sequence can comprise a plurality of further organic layers. Preferably, the organic layer sequence comprises at least one hole transport layer that adjoins the emitter layer, for example. Particularly preferably, the organic layer sequence comprises at least one hole injection layer that is provided for effectively injecting holes into the organic layer sequence. The hole injection layer can comprise or consist of PEDOT:PSS, for example. Preferably, the hole injection layer comprises small organic molecules having a p-doping, which are introduced into the organic layer sequence by vapor deposition, for example. By way of example, the p-doped small, organic molecules are 1T-NATA (4,4',4''-tris(N-(naphthalen-1-yl)-N-phenylamino)triphenylamine) comprising 10% tetrakis-Cu(I) perfluorobenzoate, Cu(I)pFBz for short. Furthermore, the organic layer sequence can comprise at least one electron transport layer and/or at least one electron injection layer.

The optional hole transport layer and the optional electron transport layer each have for example a thickness of $\geq 10$ nm, for example $\geq 30$ nm, for example $\geq 50$ nm. Alternatively or additionally, the hole transport layer and the electron transport layer each have a thickness of $\leq 300$ nm, for example $\leq 200$ nm, for example $\leq 100$ nm.

The optional hole injection layer and the optional electron injection layer each have for example a thickness of $\geq 10$ nm, for example $\geq 30$ nm, for example $\geq 50$ nm. Alternatively or additionally, the hole injection layer and the electron injection layer each have a thickness of $\leq 150$ nm, for example $\leq 120$ nm, for example $\leq 100$ nm.

Overall, the organic layer sequence has for example a total thickness of $\geq 50$ nm or $\geq 200$ nm or $\geq 500$ nm. Alternatively or additionally, the organic layer sequence has for example a total thickness of $\leq 2000$ nm, for example $\leq 1000$ nm, for example $\leq 700$ nm.

In accordance with at least one embodiment of the organic light-emitting component, the latter comprises a first electrode and a second electrode. The first electrode is embodied as an anode, for example. The second electrode is embodied as a cathode, for example. The anode and the cathode can serve for electrically contacting the organic layer sequence.

In particular, the organic layer sequence can be arranged between the anode and the cathode. By way of example, the anode adjoins a hole injection layer of the organic layer sequence. The cathode can adjoin an electron injection layer of the organic layer sequence, for example.

The anode and/or the cathode preferably comprise(s) a transport material. Preferably, the anode and/or the cathode consist(s) of a material that is transparent to the light emitted by the emitter layer, for example a transparent oxidic material, TCO for short, such as, for example, indium tin oxide, ITO for short. Furthermore, an electrode, for example the anode or the cathode, can comprise a reflective material, for example silver or aluminum.

The anode and the cathode each have a thickness of $\geq 20$ nm, for example $\geq 30$ nm, preferably $\geq 50$ nm. Alternatively or additionally, the anode and the cathode each have a thickness of $\leq 400$ nm, for example $\leq 300$ nm, for example $\leq 250$ nm.

In accordance with at least one embodiment, the organic light-emitting component comprises at least one nanoparticle layer. In this case, a nanoparticle layer is an organic layer of the organic layer sequence that is provided with first nanoparticles. In particular, by way of example, all the organic layers of the organic layer sequence can be embodied as nanoparticle layers. Alternatively, only the emitter layer or the emitter layers for example can be provided as a nanoparticle layer or nanoparticle layers.

The first nanoparticles have a refractive index. Furthermore, each organic layer comprises an organic material, which can be for example a mixture of different organic molecules. The organic material of each organic layer likewise has a refractive index. Furthermore, the anode, the cathode and the carrier each have a refractive index.

The refractive index here should be understood to mean in each case the refractive index of the relevant material in the first wavelength range of the light emitted by the emitter layer. The refractive index at the first wavelength or the refractive index averaged over the entire first wavelength range is crucial here.

In accordance with at least one embodiment of the organic light-emitting component, the refractive index of the first nanoparticles is less than at least one refractive index of an organic material of one of the organic layers. Preferably, the refractive index of the first nanoparticles is less than the refractive index of the organic material of at least one nanoparticle layer. Particularly preferably, the refractive index of the first nanoparticles is less than the refractive index of all the organic materials that the organic layer sequence comprises. Alternatively or additionally, the refractive index of the first nanoparticles can be less than the average refractive index of all the organic materials of the organic layer sequence.

By way of example, the refractive index of the organic material of a nanoparticle layer can be greater than the refractive index of the first nanoparticles. The relevant nanoparticle layer then has a refractive index that is less than the refractive index of the organic material in said nanoparticle layer.

In accordance with at least one embodiment of the organic light-emitting component, at least one nanoparticle layer is not in direct contact with the anode. By way of example, the emitter layer which is separated from the anode by a hole transport layer can be embodied as a nanoparticle layer. By way of example, a hole transport layer which is separated from the anode by a hole injection layer can also be embodied as a nanoparticle layer.

In accordance with at least one embodiment of the organic light-emitting component, the first nanoparticles have a diameter. The diameter of the first nanoparticles is ≤one quarter or ≤one eighth or ≤one twelfth of the first wavelength at which the light emitted by the emitter layer has an intensity maximum. If the intensity maximum of the emitted light in the first wavelength range at the first wavelength is at a wavelength of 600 nm, for example, then the diameter of the first nanoparticles is at most 150 nm, for example ≤75 nm, for example ≤50 nm.

The diameter of a first nanoparticle can be understood here to mean for example the D50 diameter of a distribution of first nanoparticles. In this case, assuming spherical first nanoparticles, the diameter is calculated from the volume occupied by the first nanoparticles. In this case, 50% of all the first nanoparticles have a diameter smaller than the D50 diameter. For aspherical particles, too, the D50 diameter can be defined from the volume of all the particles. In this case, the D50 diameter should be understood to mean that diameter that spherical particles would have in accordance with the volume of the aspherical particles. The diameter of an aspherical particle can therefore be understood to mean a median diameter, for example.

In at least one embodiment of the organic light-emitting component, the latter comprises a carrier and an organic layer sequence arranged on the carrier, wherein the organic layer sequence comprises at least two organic layers. At least one of the organic layers is embodied as an emitter layer, which emits light in a first wavelength range having an intensity maximum at a first wavelength. Furthermore, the organic light-emitting component comprises a first and a second electrode, wherein the first electrode is embodied as an anode and the second electrode is embodied as a cathode. The anode and the cathode serve for electrically contacting the organic layer sequence. Furthermore, the organic light-emitting component comprises at least one nanoparticle layer, wherein a nanoparticle layer is an organic layer of the organic layer sequence that is provided with first nanoparticles. The first nanoparticles have a refractive index that is less than at least one refractive index of an organic material of one of the organic layers. Furthermore, at least one nanoparticle layer is not in direct contact with the anode. Furthermore, the first nanoparticles have a diameter that is less than one quarter of the first wavelength at which the light emitted by the emitter layer has an intensity maximum.

Preferably, the refractive index of the first nanoparticles is less than the refractive index of the organic material of at least one nanoparticle layer. The refractive index of the relevant nanoparticle layer and thus the refractive index of the entire organic layer sequence are reduced in this way. This is particularly advantageous for efficient coupling-out of light from the organic layer sequence.

Furthermore, in the case of the organic light-emitting component described here, the first nanoparticles are chosen such that their diameter is in particular less than one quarter of the wavelength at which the light emitted by the emitter layer has an intensity maximum. As a result, the first nanoparticles do not act, or act only negligibly, as scattering centers for the emitted light.

Organic layers used in organic LEDs usually have a refractive index in the region of n≈1.8. The material layers disposed downstream of the organic layer sequence usually have a lower refractive index. By way of example, a material layer disposed downstream of the organic layer sequence can comprise glass, having a refractive index of approximately 1.5. On account of such a difference in refractive index between the material layer and the organic layer sequence, part of the light radiation generated in the organic layer sequence is reflected at the interface with the material layer. Light subjected to total internal reflection cannot be coupled out from the organic layer sequence. As a result of the first nanoparticles being introduced into at least or exactly one of the organic layers, the refractive index of the entire organic layer sequence can be reduced. Overall, therefore, an organic light-emitting component having an improved light coupling-out efficiency can be produced as a result of the first nanoparticles being introduced into the organic layer sequence. This furthermore brings about the effect that the organic light-emitting component, in conjunction with less input power, can yield an identical or higher light power compared with an organic light-emitting component without such nanoparticles.

Furthermore, the chemical structure of individual organic materials can also be altered to an extent such that the refractive index of said materials is reduced. However, this method is limited to specific organic materials and therefore cannot be employed for all organic materials. Furthermore, limits are imposed on the reduction of the refractive index of an organic material layer by chemical modification.

In accordance with at least one embodiment of the organic light-emitting component, the first nanoparticles have a diameter of ≤30 nm, for example ≤20 nm, for example ≤10 nm. Alternatively or additionally, the diameter of the first nanoparticles is ≥1 nm, for example ≥3 nm, for example ≥5 nm.

In accordance with at least one embodiment of the organic light-emitting component, the first nanoparticles preferably comprise a material component that is at least partly transparent to the light generated by the emitter layer. By way of example, the first nanoparticles comprise at least one metal fluoride and/or metal oxide and/or semiconductor oxide, such as, for example, silicon oxide ($SiO_2$) and/or magnesium fluoride ($MgF_2$). Further possible materials of the first nanoparticles are, for example, polytetrafluoroethylene, PTFE for short, and derivatives thereof, cryolite or $Na_3AlF_6$, respectively, or polymethyl methacrylate, PMMA for short.

Silicon oxide has a refractive index of n≈1.5, magnesium fluoride of n≈1.38, PTFE of n≈1.3-1.4, cryolite of n=1.34, and PMMA of n=1.49 for visible light. The refractive index of these materials is thus less than the typical refractive index of an organic layer of n≈1.8. As a result, the refractive index of the organic layer in which the first nanoparticles are introduced can be reduced to a value which, according to the proportion by volume of the first nanoparticles, is between the refractive index of the organic material and the refractive index of the first nanoparticles.

In accordance with at least one embodiment of the organic light-emitting component, an organic layer of the organic layer sequence that directly adjoins the anode is free of first nanoparticles. Furthermore, the organic layer adjoining the anode can be embodied as a hole injection layer.

The hole injection layer can advantageously reduce the energy barrier required for injecting holes into the organic material. In particular, the contact properties between the anode and the hole injection layer, especially the size of the contact area, play an important part. The greater the contact area, the more effectively holes can be injected into the organic layer sequence. Introducing first nanoparticles into the hole injection layer can reduce the size of the contact area between hole injection layer and anode, which would result in a reduced hole injection efficiency. Therefore, for the efficiency of the organic light-emitting component it may prove to be advantageous for the hole injection layer not to be provided with first nanoparticles. Furthermore, the hole injection layer is typically thin, for example 50 nm. The optical effect that would be achieved by introducing first nanoparticles into the hole injection layer is thus small. Furthermore, a layer, for example an electron injection layer, that adjoins the cathode can also be free of first nanoparticles. If both the layer adjoining the anode and the layer adjoining the cathode are free of first nanoparticles, the organic layer sequence comprises at least three organic layers.

In accordance with at least one embodiment of the organic light-emitting component, the proportion by volume of the first nanoparticles in the at least one nanoparticle layer is at least 10%, for example ≥30%, for example ≥50%. Alternatively or additionally, the proportion by volume of the first nanoparticles in the at least one nanoparticle layer is a maximum of 70%, for example ≤65%, for example ≤60%. Preferably, the proportion by volume of the first nanoparticles is more than 50%.

In accordance with at least one embodiment of the light-emitting organic component, the refractive index of the first nanoparticles is ≤1.7, for example ≤1.5, for example ≤1.45 or 1.4 or 1.35.

In accordance with at least one embodiment of the light-emitting organic component, the refractive index of the nanoparticle layer has a value similar to the refractive index of the anode and/or of the cathode and/or of the carrier. Preferably, the difference between the refractive index of the nanoparticle layer and the refractive index of the anode and/or of the cathode and/or the carrier is ≤0.1, for example ≤0.05, for example ≤0.01. Particularly preferably, all the organic layers have a refractive index whose value deviates by ≤0.1, for example ≤0.05, for example ≤0.02, from the refractive index of the anode and/or of the cathode and/or of the carrier.

In accordance with at least one embodiment of the organic light-emitting component, the first nanoparticles comprise a light-converting material. The light-converting material can at least partly absorb the light in the first wavelength range emitted by the emitter layer and convert it into light in a second wavelength range.

In other words, the first nanoparticles not only have the effect of reducing the refractive index, but can also influence the light spectrum emitted by the component. Therefore, the color of the light is not exclusively defined by the emitter materials present in the emitter layer, but also by means of the first nanoparticles or the converting material present in the first nanoparticles, respectively. This can advantageously contribute to a facilitated setting of a color locus of the light emitted by the component. By way of example, the light emitted by the emitter layer can be in the blue spectral range. The light re-emitted by the conversion material can be in the green-yellow wavelength range, for example.

By way of example, the first nanoparticles for this purpose comprise or consist of a doped metal fluoride, for example a metal fluoride doped with rare earths, such as $CaF_2:Tb^{2+}$.

In accordance with at least one embodiment of the organic light-emitting component, the first nanoparticles comprise at least one dye. The dye can at least partly absorb a light in the first wavelength range emitted by the emitter layer. The light spectrum emitted by the organic component can thus be set further by the first nanoparticles or by the dyes in the first nanoparticles, respectively. By way of example, the dye is a UV filter.

Advantageously, no separate layer or no separate structures, in particular separate layers comprising dyes and/or conversion materials, need be introduced into the component. As a result, the method for producing the organic light-emitting component is considerably simplified.

In accordance with at least one embodiment of the organic light-emitting component, the latter comprises second nanoparticles. The second nanoparticles can be introduced in one or a plurality of the organic layers; in particular, the second nanoparticles can be introduced into the same organic layers as the first nanoparticles or into different organic layers than the first nanoparticles. By way of example, only the emitter layer or the emitter layers can comprise second nanoparticles. Alternatively or additionally, an organic layer that adjoins the anode or an organic layer that adjoins the cathode can be free of second nanoparticles.

The second nanoparticles preferably have a greater diameter than the first nanoparticles. By way of example, the diameter of the second nanoparticles is ≥80 nm, for example ≥150 nm, for example ≥300 nm or 500 nm. Alternatively or additionally, the diameter of the second nanoparticles can be ≤900 nm, for example ≤600 nm, for example ≤350 nm.

With their comparatively large diameters, the second nanoparticles not only have the effect of altering the refractive index, but also act as scattering centers for the light in the first wavelength range emitted by the emitter layer. By means of such scattering centers, at which light is scattered diffusely, it is possible to further reduce the proportion of the reflected light, or light subjected to total internal reflection, in the organic layer sequence.

The second nanoparticles can comprise or consist of the same material or the same materials as the first nanoparticles. In particular, the second nanoparticles can have a lower refractive index than the refractive index of the organic material of the organic layer into which the second nanoparticles are introduced. As an alternative thereto, however, the refractive index of the second nanoparticles can also be greater than the refractive index of the organic material of the organic layer into which the second nanoparticles are introduced.

Furthermore, the second nanoparticles can also have light-converting and/or light-absorbing properties.

In accordance with at least one embodiment of the organic light-emitting component, the latter comprises coupling-out structures. By way of example, coupling-out structures can be fitted to the cathode side or to the anode side of the organic layer sequence, for example between the anode and the organic layer sequence and/or between the cathode and the organic layer sequence. Furthermore, coupling-out structures can also be fitted to a side of the carrier facing away from the organic layer sequence.

The coupling-out structures can be embodied in the form of coupling-out films or as structured interfaces. Preferably, the coupling-out structures can comprise scattering centers, for example in the form of second nanoparticles, at which the light emitted by the emitter layer is scattered diffusely.

In accordance with at least one embodiment of the organic light-emitting component, the anode and/or the cathode comprise(s) a transparent conductive oxide material, TCO for short. Alternatively or additionally, the anode and/or the cathode can comprise nanowires composed, for instance, of a metal such as silver. Alternatively or additionally, the anode and/or the cathode can be embodied as a metal lattice, which is preferably integrated into a hole injection layer, HIL for short, and/or into an electron injection layer, EIL for short.

An organic light-emitting component described here is explained in greater detail below on the basis of exemplary embodiments with reference to drawings. In this case, identical reference signs indicate identical elements in the individual figures. However, relations to scale are not illustrated here; rather, individual elements may be illustrated with an exaggerated size in order to afford a better understanding.

In the figures:

FIGS. 1 to 5 show schematic illustrations of exemplary embodiments of organic light-emitting components described here.

FIG. 1 depicts a sectional illustration of a first exemplary embodiment of an organic light-emitting component 100. The component 100 comprises a carrier 1, on which an anode 3 is arranged. An organic layer sequence 2 is arranged on that side of the anode 3 which faces away from the carrier 1. Furthermore, a cathode 4 is disposed downstream of the organic layer sequence 2 in a direction away from the carrier.

The carrier 1 preferably comprises a material that is transparent to a light generated by the organic layer sequence 2, for example glass.

The anode 3 preferably comprises a transparent conductive material. By way of example, the anode 3 is produced from indium tin oxide, ITO for short. Alternatively or additionally, the anode 3 can comprise silver nanowires that result in a better conductivity of the anode 3. Moreover, or in addition, the anode 3 can be produced from an organic material and comprise a metal lattice. The anode 3 has a thickness of approximately 100 nm, for example.

The organic layer sequence 2 arranged on the anode 3 comprises three organic layers in the exemplary embodiment given. The layer adjoining the anode 3 is embodied as a hole injection layer 21, HIL for short. The hole injection layer 21 can comprise or consist of a material component composed of PEDOT:PSS, for example. The HOMO, Highest Occupied Molecular Orbital, of the hole injection layer preferably lies energetically between the conduction band level of the anode 3 and the HOMO of the organic layer adjoining the hole injection layer 21. The hole injection layer 21 can thus reduce the energy barrier for hole injection from the anode 3. The hole injection layer 21 has a thickness of approximately 50 nm, for example.

A hole transport layer 22 is arranged in the layer sequence 2 on that side of the hole injection layer 21 which faces away from the carrier 1. The hole transport layer 22 is provided for effectively transferring holes from the anode 3 into further organic layers of the layer sequence 2. The hole transport layer 22 has a thickness of approximately 100 nm, for example.

An emitter layer 23 is disposed downstream on that side of the hole transport layer 22 which faces away from the carrier. The emitter layer 23 can comprise fluorescent or phosphorescent emitter materials, for example. The emitter layer can for example comprise organic polymers, organic oligomers, organic monomers or organic small non-polymeric molecules or contain a combination of these materials. The emitter materials introduced into the emitter layer 23 can be provided for generating light 200 having different wavelengths, for example for generating blue light or green light or red light. The emitter layer 23 can for example also comprise a mixture of different emitters, such that the emitter layer 23 emits mixed light 200, for example white light. Furthermore, the emitter layer 23 can comprise a plurality of individual emitter layers which for example each emit light of different colors. By way of example, a first emitter layer can emit red light, a second emitter layer can emit green light and a third emitter layer can emit blue light. The emitter layer 23 has a thickness of approximately 200 nm, for example.

In the exemplary embodiment in FIG. 1, the emitter layer 23 is embodied as a nanoparticle layer 20 comprising first nanoparticles 5. In this case, the first nanoparticles 5 are preferably chosen such that their diameter is less than one quarter of a wavelength $\lambda$max at which the light 200 emitted by the emitter layer 23 has an intensity maximum. By way of example, the diameter of the first nanoparticles 5 is less than one tenth of the wavelength $\lambda$max.

The first nanoparticles 5 preferably have a refractive index $n_N$ that is less than the refractive index of the organic material of the organic layer into which the first nanoparticles 5 are introduced, which is the emitter layer 23 in FIG. 1. By way of example, the refractive index of the first nanoparticles is 1.5, and the refractive index of the organic material of the emitter layer is 1.8, for example.

A cathode 4 is arranged on that side of the layer stack 2 which faces away from the carrier 2. The cathode 4, like the anode 3, can be produced from a transparent conductive material or comprise such a material. In the exemplary embodiment in FIG. 1, the cathode is produced from a reflective material, for example from aluminum or from silver. The cathode 4 has a thickness of 50 nm, for example.

In the exemplary embodiment in FIG. 1, the light 200 emitted by the emitter layer 23 is coupled out from the component 100 via the anode 3 and the carrier 1.

Furthermore, in FIG. 1, the organic layers indicated are preferably arranged one directly above another. Alternatively or additionally, further organic layers, such as electron injection layers or coupling-out layers, can be integrated into the organic layer sequence. These additional layers can be fitted for example as intermediate layers between the organic layers shown in FIG. 1. The same correspondingly applies to all the other exemplary embodiments.

The component 100 indicated in FIG. 1 can be produced by the following process steps, for example:

In a first step, the anode 3 is applied to a carrier 1. In a second step, the organic layers of the layer sequence 2 are applied successively above the anode 3 by means of solvent-based processes, for example by means of a spin-coating method. During the application of the emitter layer 23, the organic materials of the emitter layer 23 and the first nanoparticles 5 can be dissolved in a common solvent and thus mixed. In this case, the first nanoparticles 5 can be provided with a surface functionalization, for example, in order to ensure the solubility thereof in the chosen solvent. In a third process step, the metal cathode 4 is applied to the organic layer sequence 2 by means of a vapor deposition process, for example.

Alternatively or additionally, the organic layers and the first nanoparticles 5 can also be applied in a common evaporation process. By way of example, an organic material and the material forming the first nanoparticles 5 can be co-evaporated by thermal vapor deposition, wherein the material forming the first nanoparticles 5 agglomerates to form first nanoparticles 5 in the vapor-deposited layer.

Figure 2:
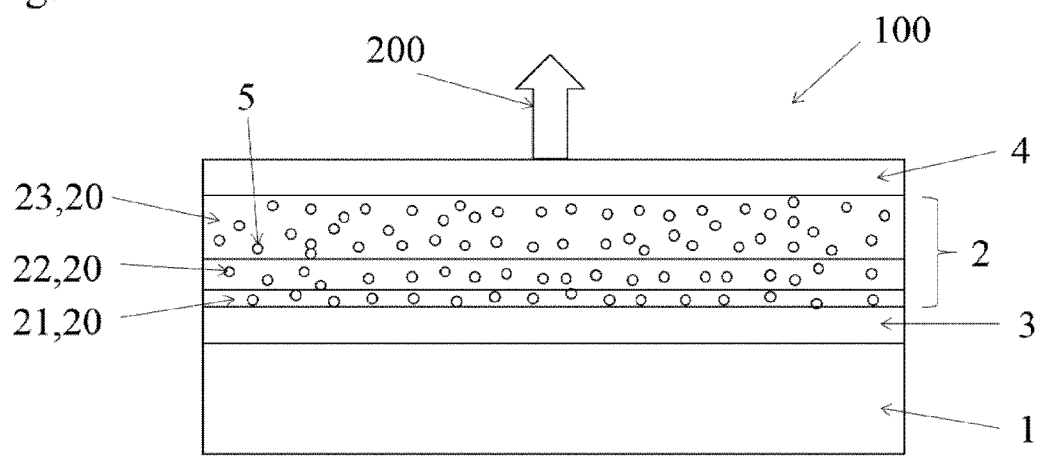

FIG. 2 illustrates a further exemplary embodiment of the light-emitting organic component 100. In this case, the component 100 comprises the same layer sequence as, or a similar layer sequence to, the component 100 illustrated in FIG. 1. In contrast to the exemplary embodiment illustrated in FIG. 1, the anode 3 is not transparent to the light 200 emitted by the emitter layer 23. The anode 3 is produced for example from a metal such as silver or aluminum and can be reflective to the light 200 emitted by the emitter layer 23. Conversely, the cathode 4 comprises or consists of a transparent conductive material.

Furthermore, in FIG. 2 all the organic layers of the organic layer sequence 2 comprise first nanoparticles 5. Preferably, in this case the refractive index of the first nanoparticles 5 in each organic layer is less than the refractive index of the organic materials of the respective organic layer.

Figure 3:
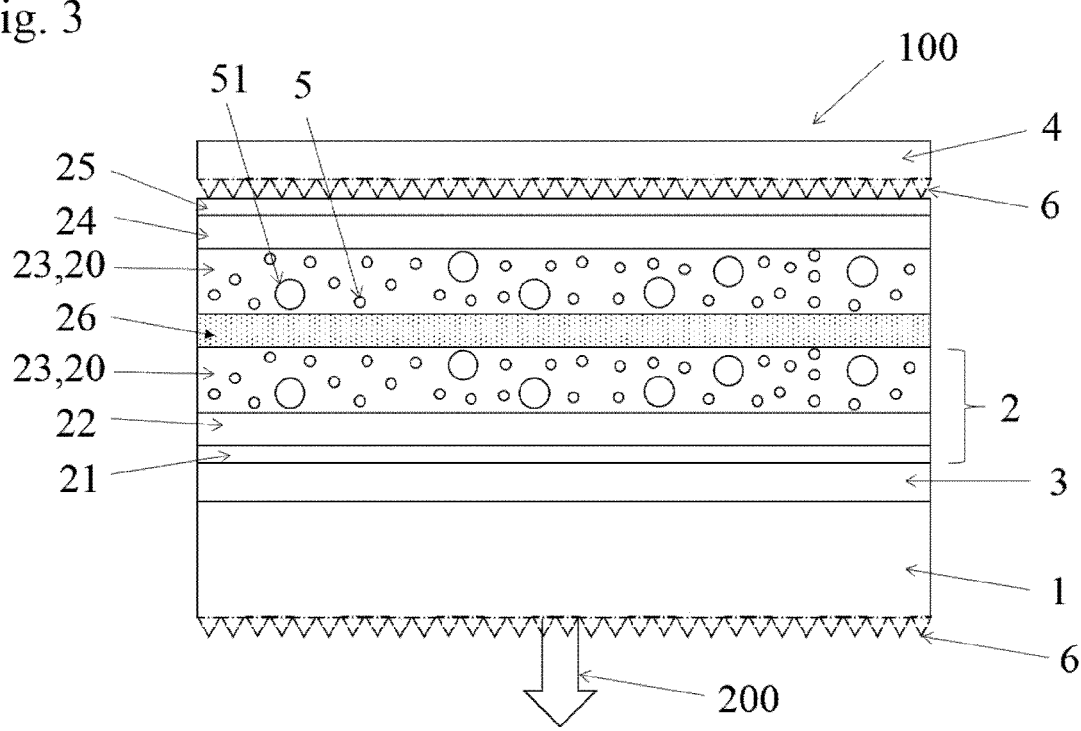

In the case of the exemplary embodiment in accordance with FIG. 3, the component 100 comprises further organic layers. By way of example, an electron transport layer 24 and an electron injection layer 25 are arranged between an emitter layer 23 and the cathode 4. In this case, the electron injection layer 25 directly adjoins the cathode 4 and provides for effective coupling of electrons from the cathode 4 into the organic layer sequence 2; for example, the electron injection layer 25 reduces the energy barrier for the injection of electrons. The electron injection layer 25 has a thickness of 50 nm, for example.

In FIG. 3, the electron transport layer 24 is arranged between the electron injection layer 25 and the emitter layer 23. The electron transport layer 24 provides for effectively transferring the electrons injected from the cathode 4 into the emitter layer 23. The electron transport layer 24 has a thickness of 100 nm, for example.

In FIG. 3, as in FIG. 1, the light 200 is emitted from the component 100 via the anode 3 and the carrier 1. In this case, the anode 3 is transparent to the light 200 emitted by the emitter layer 23, and the cathode 4 can be reflective to the light 200 emitted by the emitter layer 23; by way of example, it can consist of silver, aluminum or gold or comprise silver, aluminum or gold.

The component 100 in FIG. 3 comprises two emitter layers 23. Alternatively, however, a plurality of emitter layers, for example three or four emitter layers, can also be integrated into the layer sequence 2 (not shown in FIG. 3). The two emitter layers 23 are connected to one another via a charge generating layer 26, CGL for short, for example.

In FIG. 3, exclusively the emitter layers 23 comprise first nanoparticles 5. In addition to the first nanoparticles 5, the emitter layers 23 comprise second nanoparticles 51. In this case, the second nanoparticles 51 can have a greater diameter than the first nanoparticles 5. By way of example, the diameter of the second nanoparticles 51 is ≥100 nm, such that the second nanoparticles 51 preferably act as scattering centers for the light 200 emitted by the emitter layers 23 and thus reduce the proportion of light subjected to total internal reflection. The diameter of the first and/or second nanoparticles is preferably at most 50% of the diameter of the respective organic layers which comprise the first and/or second nanoparticles.

The second nanoparticles 51 can be arranged in the same organic layer or in the same organic layers as the first nanoparticles 5, as shown in FIG. 3. Alternatively, however, the second nanoparticles 51 can also be arranged in other or additional organic layers.

In FIG. 3, coupling-out structures 6 are arranged on that side of the carrier 1 which faces away from the layer sequence 2. The coupling-out structures 6 can be applied to the carrier 1 in the form of a coupling-out film, for example. Alternatively or additionally, structurings of the carrier 1 can serve as coupling-out structures 6. Preferably, by means of the first nanoparticles 5 and possibly by means of the second nanoparticles 51, the refractive index of the organic layer sequence 2 is reduced to an extent such that the refractive index of the organic layer sequence 2 is less than or equal to the refractive index of the carrier 1. In this case, light can be coupled out from the organic layer sequence 2 into the carrier 1 without losses. The coupling-out structures 6 on the carrier 1 then serve only for coupling out the light from the carrier 1 effectively into the surroundings, for example into the air.

Furthermore, the coupling-out structures 6 can also be arranged in the component 100. By way of example, as shown in FIG. 3, the coupling-out structures 6 can additionally or alternatively be arranged between the cathode 4 and the organic layer sequence 2. The efficiency of coupling out light from the organic layer sequence 2 can further be increased by means of such coupling-out structures 6.

In particular, the coupling-out structures 6 can comprise the second nanoparticles 51 or consist of the latter (not shown in FIG. 3). In this case, the nanoparticles 51 act for example as scattering centers for the light 200 emitted by the organic layer sequence 2.

Figure 4:
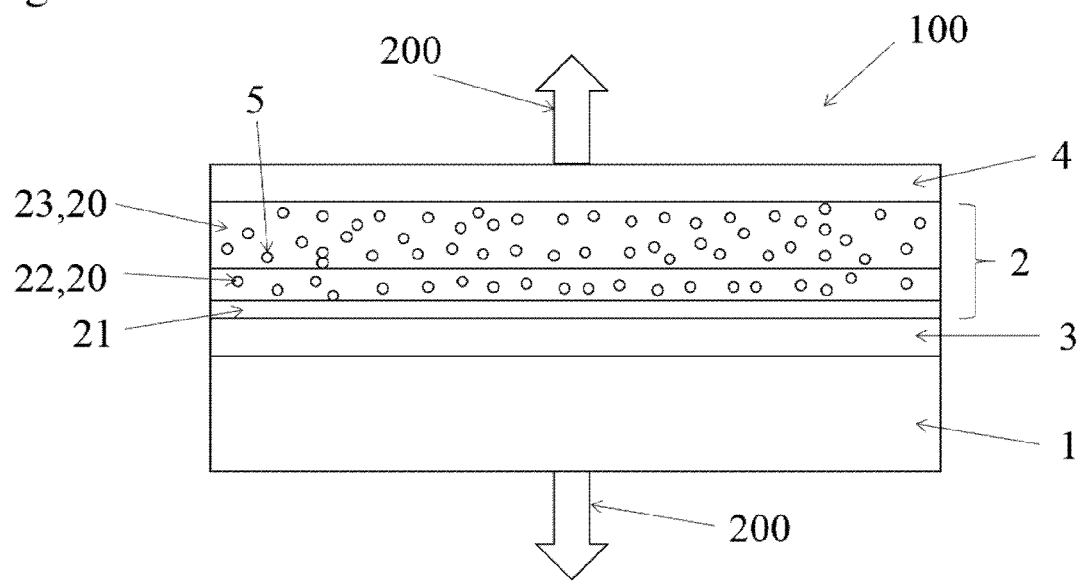

FIG. 4 shows a further exemplary embodiment of the organic light-emitting component 100, wherein the light generated in the organic layer sequence 2 is emitted from the component 100 via the anode 3 and the cathode 4. In this case, the anode 3, the cathode 4 and the carrier 1 are at least partly transparent to the light emitted by the emitter layer 23. Furthermore, the component 100 in the exemplary embodiment indicated here comprises three organic layers, of which one organic layer directly adjoining the anode 3, for example the hole injection layer 21, is free of first nanoparticles 5 and second nanoparticles 51. Advantageously, the contact area between the anode 3 and the hole injection layer 21 is thus not disturbed or reduced by first nanoparticles 5 and/or second nanoparticles 51. This can in turn have an advantageous effect on the efficiency for the injection of holes into the organic layer sequence 2 and thus have an advantageous effect for the efficiency of the entire organic component 100.

Figure 5:
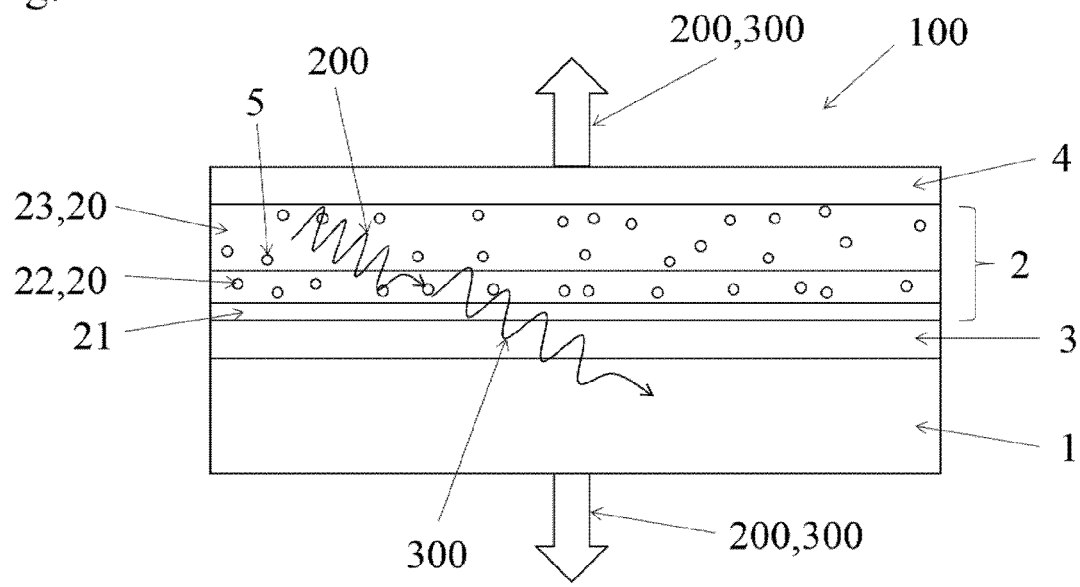

The exemplary embodiment in accordance with FIG. 5 shows the same component as in FIG. 4. In addition, the first nanoparticles 5 illustrated in FIG. 5 optionally comprise a conversion material suitable for at least partly converting the light 200 in a first wavelength range emitted by the emitter layer 23 into light 300 in a second wavelength range. The first nanoparticles 5 can thus serve for an improved or facilitated setting of the color locus of the light emitted by the component 100.

Additionally or alternatively, the nanoparticles 5 can comprise a dye that absorbs part of the light 200 in the first wavelength range and thus generates light 300 in a second wavelength range. Furthermore, second nanoparticles 51 comprising light-converting or light-absorbing material can also be introduced into the organic layer sequence 2.

The invention described here is not restricted by the description on the basis of the exemplary embodiments. Rather, the invention encompasses any novel feature and also any combination of features, which in particular includes any combination of features in the patent claims, even if this feature or this combination itself is not explicitly specified in the patent claims or exemplary embodiments.

This patent application claims the priority of German patent application 10 2013 113 486.6, the disclosure content of which is hereby incorporated by reference.

The invention claimed is:

1. A light-emitting component, comprising:
    a carrier;
    an organic layer sequence comprising at least two organic layers, the organic layer sequence being arranged on the carrier,
    wherein at least one of the organic layers is embodied as an emitter layer, which emits light in a first wavelength range having an intensity maximum at a first wavelength;
    a first electrode and a second electrode,
    wherein the first electrode is embodied as an anode and the second electrode is embodied as a cathode,
    wherein the anode and the cathode are provided for electrically contacting the organic layer sequence, and
    wherein the organic layer sequence is arranged between the anode and the cathode; and
    at least one nanoparticle layer, wherein a nanoparticle layer is an organic layer of the organic layer sequence that is provided with first nanoparticles,
    wherein the first nanoparticles have a refractive index ($n_N$) that is less than at least one refractive index of an organic material of one of the organic layers,
    wherein at least one nanoparticle layer is not in direct contact with the anode, and
    wherein the first nanoparticles have a diameter that is less than one quarter of the first wavelength.

2. The component according to claim 1, wherein at least one organic layer that adjoins the anode is free of first nanoparticles,
    wherein the layer is embodied as a hole injection layer, and
    wherein the difference between the refractive index of the nanoparticle layer and the refractive index of the anode and/or of the cathode and/or of the carrier is ≤0.1.

3. The component according to claim 1, wherein the first nanoparticles have a diameter of less than or equal to 10 nm, and
    wherein the first nanoparticles comprise $SiO_2$ and/or $MgF_2$ as material component.

4. The component according to claim 1, wherein at least one organic layer that adjoins the anode is free of first nanoparticles, and
    wherein the layer is embodied as a hole injection layer.

5. The component according to claim 1, wherein all the organic layers are embodied as nanoparticle layers.

6. The component according to claim 1, wherein a proportion by volume of the first nanoparticles in the at least one nanoparticle layer is at least 10% and a maximum of 70%.

7. The component according to claim 1, wherein the refractive index of the first nanoparticles ($n_N$) for visible light is between 1.3 and 1.6.

8. The component according to claim 1, wherein the first nanoparticles comprise a light-converting material, which at least partly absorbs light in a first wavelength range emitted by the emitter layer and converts it into light in a second wavelength range.

9. The component according to claim 1, wherein, in addition to the first nanoparticles, second nanoparticles are introduced into the organic layer sequence, and
    wherein the second nanoparticles have diameters of ≥150 nm.

10. The component according to claim 1, wherein the at least one emitter layer has a thickness of between 100 nm and 400 nm inclusive, and
    wherein the organic layer sequence has a total thickness of between 200 nm and 1000 nm inclusive.

11. The component according to claim 1, wherein the layer sequence comprises a plurality of emitter layers provided for emitting electromagnetic radiation, and
    wherein at least one charge generating layer is situated between at least two of the emitter layers.

12. The component according to claim 1, wherein exclusively the emitter layer or the emitter layers comprise(s) first and/or second nanoparticles.

13. The component according to claim 1, wherein coupling-out structures are introduced between at least one of the two electrodes and the organic layer sequence.

14. The component according to claim 12, wherein the coupling-out structures comprise the second nanoparticles.

15. The component according to claim 1, wherein the anode and/or the cathode comprise(s) a transparent conductive oxide material and/or silver nanowires and/or a metal lattice that is integrated into an organic hole injection layer and/or into an organic electron injection layer.

16. A light-emitting component, comprising:
    a carrier;
    an organic layer sequence comprising at least two organic layers, the organic layer sequence being arranged on the carrier,
    wherein at least one of the organic layers is embodied as an emitter layer, which emits light in a first wavelength range having an intensity maximum at a first wavelength; and
    a first electrode and a second electrode,
    wherein the first electrode is embodied as an anode and the second electrode is embodied as a cathode,
    wherein the anode and the cathode are provided for electrically contacting the organic layer sequence,
    wherein all the organic layers are embodied as nanoparticle layers, except one organic layer that directly adjoins the anode,
    wherein a nanoparticle layer is an organic layer of the organic layer sequence that is provided with first nanoparticles,
    wherein the first nanoparticles have a refractive index ($n_N$) that is less than at least one refractive index of an organic material of one of the organic layers,
    wherein the first nanoparticles have a diameter that is less than one quarter of the first wavelength,
    wherein the first nanoparticles have a diameter of less than or equal to 10 nm, wherein the difference between the refractive index of the nanoparticle layer and the refractive index of the anode and/or of the cathode and/or the carrier is ≤0.1, wherein a proportion by volume of the first nanoparticles in the at least one nanoparticle layer is at least 10% and a maximum of 70%, and wherein the organic layer that adjoins the anode is free of first nanoparticles.

17. A light-emitting component, comprising a carrier;

an organic layer sequence comprising at least two organic layers, the organic layer sequence being arranged on the carrier, wherein at least one of the organic layers is embodied as an emitter layer, which emits light in a first wavelength range having an intensity maximum at a first wavelength;

a first electrode and a second electrode, wherein the first electrode is embodied as an anode and the second electrode is embodied as a cathode, wherein the anode and the cathode are provided for electrically contacting the organic layer sequence, wherein all the organic layers are embodied as nanoparticle layers, wherein a nanoparticle layer is an organic layer of the organic layer sequence that is provided with first nanoparticles, wherein the first nanoparticles have a refractive index ($n_N$) that is less than at least one refractive index of an organic material of one of the organic layers, wherein the first nanoparticles have a diameter that is less than one quarter of the first wavelength, wherein the first nanoparticles have a diameter of less than or equal to 10 nm, wherein the difference between the refractive index of the nanoparticle layer and the refractive index of the anode and/or of the cathode and/or the carrier is ≤0.1, and wherein a proportion by volume of the first nanoparticles in the at least one nanoparticle layer is at least 10% and a maximum of 70%.

* * * * *